(12) United States Patent
Hua et al.

(10) Patent No.: US 7,886,813 B2
(45) Date of Patent: Feb. 15, 2011

(54) THERMAL INTERFACE MATERIAL WITH CARBON NANOTUBES AND PARTICLES

(75) Inventors: Fay Hua, Fremont, CA (US); James G. Maveety, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 11/169,520

(22) Filed: Jun. 29, 2005

(65) Prior Publication Data

US 2007/0001310 A1 Jan. 4, 2007

(51) Int. Cl.
*F28F 7/00* (2006.01)
*H01L 23/34* (2006.01)
*H01L 23/373* (2006.01)

(52) U.S. Cl. ............... 165/185; 257/713; 257/E23.11; 438/106; 438/584

(58) Field of Classification Search .................. None
See application file for complete search history.

(56) References Cited

U.S. PATENT DOCUMENTS

| | | | |
|---|---|---|---|
| 4,450,188 A * | 5/1984 | Kawasumi | 427/217 |
| 6,114,413 A * | 9/2000 | Kang et al. | 523/210 |
| 6,157,538 A * | 12/2000 | Ali et al. | 361/704 |
| 6,407,922 B1 * | 6/2002 | Eckblad et al. | 361/704 |
| 6,433,055 B1 * | 8/2002 | Kleyer et al. | 524/379 |
| 2003/0000690 A1 * | 1/2003 | Chiu et al. | 165/185 |
| 2003/0027910 A1 * | 2/2003 | Misra et al. | 524/404 |
| 2003/0077478 A1 * | 4/2003 | Dani et al. | 428/673 |
| 2003/0150604 A1 * | 8/2003 | Koning et al. | 165/185 |
| 2003/0151030 A1 | 8/2003 | Gurin | |
| 2004/0123016 A1 * | 6/2004 | Doblar et al. | 711/5 |
| 2004/0151885 A1 * | 8/2004 | Jayaraman et al. | 428/210 |
| 2004/0180209 A1 * | 9/2004 | Cheng et al. | 428/421 |
| 2004/0200879 A1 * | 10/2004 | Lewis et al. | 228/56.3 |
| 2004/0266065 A1 | 12/2004 | Zhang et al. | |
| 2005/0046017 A1 | 3/2005 | Dangelo | |
| 2005/0061496 A1 | 3/2005 | Matabayas, Jr. | |

(Continued)

FOREIGN PATENT DOCUMENTS

CN 1568542 1/2005

(Continued)

OTHER PUBLICATIONS

Zhong et al. Utilization of Carbon Fibers in Thermal Management of Microelectronics. Advanced Packaging Materials: Processes, Properties and Interfaces, 2005.Proceedings. International Symposium on. Mar. 16-18, 2005. pp. 259-265.*

(Continued)

*Primary Examiner*—Hoang-Quan T Ho
*Assistant Examiner*—Andy Huynh
(74) *Attorney, Agent, or Firm*—Schwegman, Lundberg & Woessner, P.A.

(57) ABSTRACT

A thermal interface material is provided using composite particles. Advantages include increased thermal conductivity and improved mechanical properties such as lower viscosity. In selected embodiments free particles such as metallic particles or carbon nanotubes, etc. are included in a thermal interface material along with composite particles. An advantage of including free particles along with composite particles includes improved packing density within selected embodiments of thermal interface materials.

22 Claims, 4 Drawing Sheets

U.S. PATENT DOCUMENTS

| | | |
|---|---|---|
| 2005/0116336 A1 | 6/2005 | Chopra et al. |
| 2005/0136248 A1* | 6/2005 | Leu et al. ............... 428/332 |
| 2005/0139642 A1 | 6/2005 | Koning et al. |
| 2005/0171269 A1* | 8/2005 | Hu et al. ............... 524/495 |
| 2006/0263584 A1 | 11/2006 | Schulz-Harder et al. |

FOREIGN PATENT DOCUMENTS

| | | |
|---|---|---|
| DE | 10320838 | 12/2004 |
| JP | 2004220911 | 8/2004 |

OTHER PUBLICATIONS

Jin, Sungho, "Nano Interconnects and Nanoscale Solder Bonding", *University of California*—San Diego, Professor of Materials Science, 53 pages.

"International Search Report for corresponding PCT Application No. PCT/US2006/025625", (Feb. 2, 2007), 4 pgs.

"Singapore Application Serial No. 200719076-2, Australian Written Opinion mailed Jan. 21, 2009", 5 pgs.

"China Application No. 200680023309.6, Office action mailed on Aug. 21, 2009", 24 pgs.

"Germany Application Serial No. 112006001177.4-43, Office Action mailed Mar. 12, 2009", 6 pgs.

"Singapore Application Serial No. 200719076-2, Australian Written Opinion mailed Dec. 10, 2008", 5 pgs.

"Chinese Application Serial No. 200680023309.6, Office Action Received Mailed May 12, 2010", 6 Pgs.

"Republic of Korea application No. 2007-7030500 Office action mailed Nov. 12, 2009", 3.

"Taiwan Application Serial No. 95123382, Office Action Mailed Feb. 23, 2010", 7 Pages.

* cited by examiner

THERMAL INTERFACE MATERIAL WITH CARBON NANOTUBES AND PARTICLES

TECHNICAL FIELD

Embodiments of the present invention relate generally to the field of heat transfer and, in particular, some aspects of the present invention relate to thermal management of electronic devices.

BACKGROUND

In the field of electronic systems there is an incessant competitive pressure among manufacturers to drive the performance of their equipment up while driving down production costs. This is particularly true regarding forming electronic devices such as transistors in IC's, where each new generation of IC must provide increased performance, particularly in terms of an increased number of devices and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments.

With the advent of high performance IC's and their associated packages, electronic devices have required more innovative thermal management to dissipate heat. Increasing speed and power in processors, for example, generally carry with it a "cost" of increased heat in the microelectronic die that must be dissipated.

DETAILED DESCRIPTION

Figure 1:
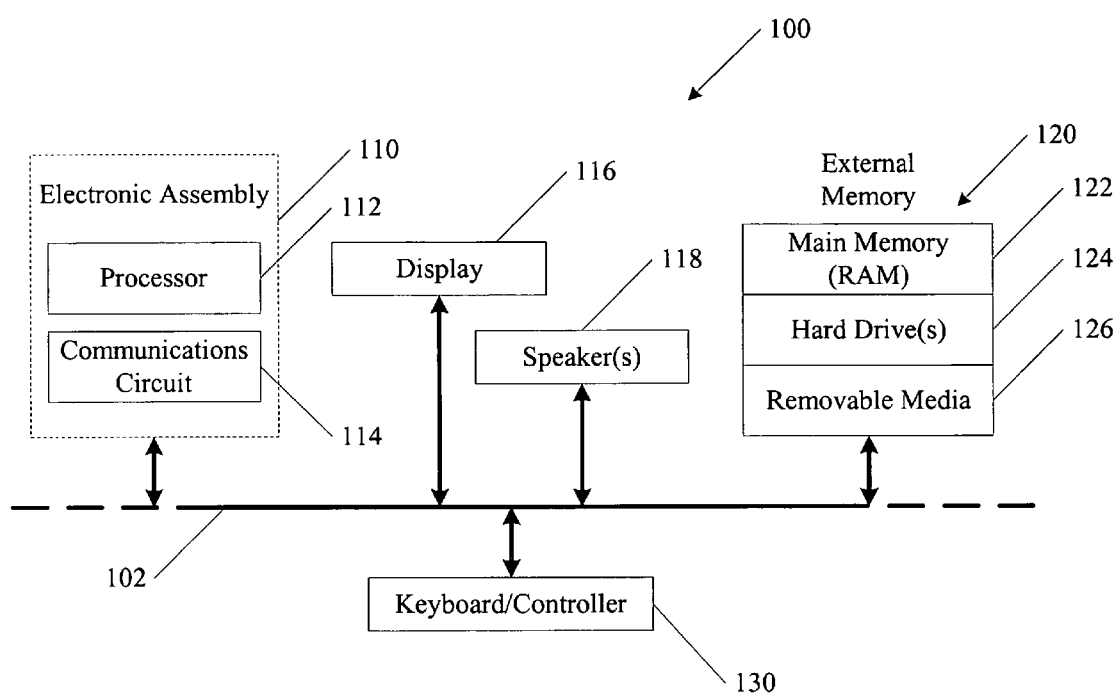
FIG. 1 illustrates an information handling device according to one embodiment of the invention.

In the following detailed description of the invention reference is made to the accompanying drawings which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, mechanical, and logical changes, etc. may be made, without departing from the scope of the present invention. The following detailed description is, therefore, not to be taken in a limiting sense, and the scope of the present invention is defined only by the appended claims.

The term "active side" as used in this description is defined as the conventional horizontal, large plane or surface of a chip or die where electrical devices have typically been fabricated, regardless of the orientation of the chip or die. The term "back side" as used in this description is defined as a conventional horizontal, large plane or surface of a chip or die that generally does not contain active devices on its surface. The term "vertical" refers to a direction perpendicular to the horizontal as defined above. Prepositions, such as "on", "higher", "lower", "above" and "below" are defined with respect to the conventional plane or surface being on the active side of the chip or die, regardless of the orientation of the chip or die.

In one embodiment, the present invention is used to transfer heat generated by electronic devices or groups of devices, such as transistors, as are commonly included on integrated circuit (IC) chips such as processor chips.

An example of an electronic device using processor chips is included to show an example of a higher level device application for embodiments of the present invention. FIG. 1 is a block diagram of an electronic device 100 incorporating at least one electronic assembly 110 utilizing a thermal conducting material in accordance with at least one embodiment of the invention. Electronic device 100 is merely one example of an electronic system in which the present invention can be used. In this example, electronic device 100 comprises a data processing system that includes a system bus 102 to couple the various components of the system. System bus 102 provides communications links among the various components of the electronic device 100 and can be implemented as a single bus, as a combination of busses, or in any other suitable manner.

An electronic assembly 110 is coupled to system bus 102. The electronic assembly 110 can include any circuit or combination of circuits. In one embodiment, the electronic assembly 110 includes a processor 112 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 110 are a custom circuit, an application-specific integrated circuit (ASIC), or the like, such as, for example, one or more circuits (such as a communications circuit 114) for use in wireless devices like mobile telephones, pagers, personal data assistants, portable computers, two-way radios, and similar electronic systems. The IC can perform any other type of function.

The electronic device 100 can also include an external memory 120, which in turn can include one or more memory elements suitable to the particular application, such as a main memory 122 in the form of random access memory (RAM), one or more hard drives 124, and/or one or more drives that handle removable media 126 such as compact disks (CD), digital video disk (DVD), and the like.

The electronic device 100 can also include a display device 116, one or more speakers 118, and a keyboard and/or controller 130, which can include a mouse, trackball, game controller, voice-recognition device, or any other device that permits a system user to input information into and receive information from the electronic device 100.

Although embodiments of the present invention are found to be effective at transferring heat from IC surfaces, the invention is not limited to heat transfer from IC surfaces. Embodiments of the invention can be used in any setting where heat is to be conducted from one surface to another. For ease of explanation, the example of cooling an IC will be used.

Figure 2A:
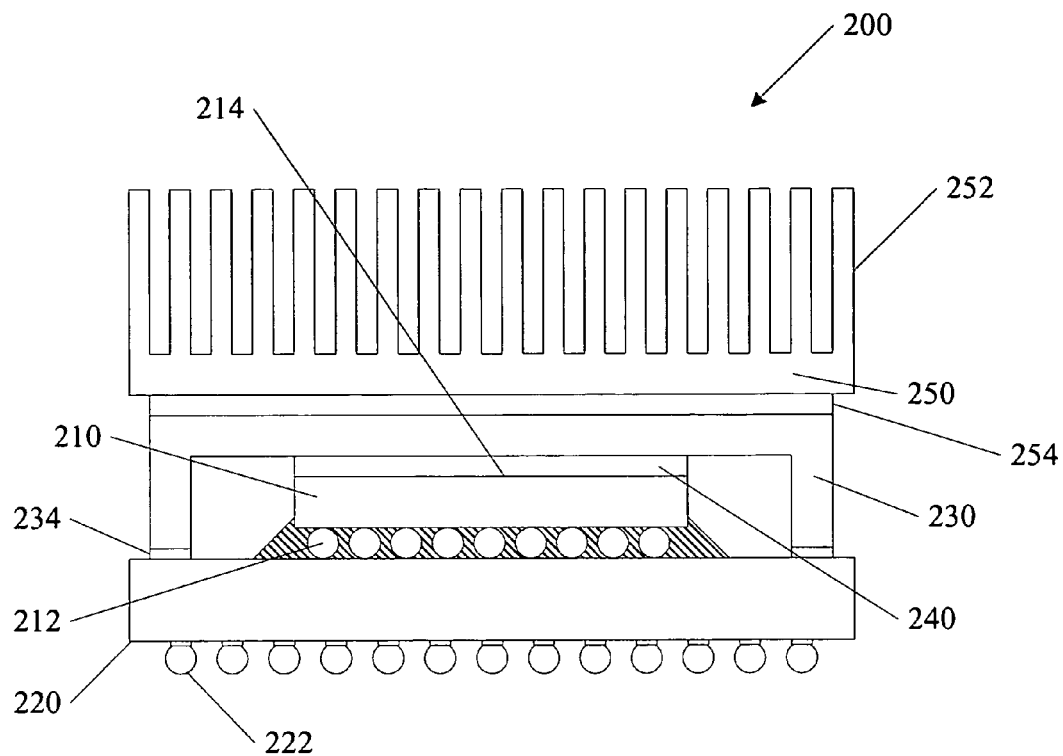
FIG. 2A illustrates an IC package according to one embodiment of the invention.

FIG. 2A shows a cross-sectional representation of an IC package 200. In embodiments where the IC die is a processor die, the IC package can be termed a processor assembly. IC package 200 includes an IC die 210 mounted in "flip-chip" orientation with its active side facing downward to couple with an upper surface of a substrate 220, such as a circuit board, through solder balls or bumps 212. Substrate 220 can be a one-layer board or a multi-layer board, and it can include additional contacts 222 on its opposite surface for mating with additional packaging structure (not shown).

Die 210 generates its heat from internal structure, including wiring traces, located near its active side; however, a significant portion of the heat is dissipated through its back side 214. Heat that is concentrated within the die is dissipated to a large surface that is in contact with the die in the form of an integrated heat spreader 230 that typically includes a metal such as copper or aluminum. In selected embodiments, the heat spreader includes an additional coating such as nickel or gold. In one embodiment, the integrated heat spreader 230 is formed into a partial enclosure, and serves as a package cover for the die 210. In one embodiment, an adhesive 234 is further included to secure the integrated heat spreader 230 to the substrate 220. To improve the thermal conductivity between the die 210 and the integrated heat spreader 230, a thermal interface material 240 is often provided between the die 210 and integrated heat spreader 230.

In one embodiment, to further dissipate heat from the integrated heat spreader 230, a heat sink 250 optionally having fins 252 is coupled to the integrated heat spreader 230. Heat sink 250 dissipates heat into the ambient environment. In one embodiment a second thermal interface material 254 is further utilized to create a thermal pathway between the integrated heat spreader 230 and the heat sink 250.

The thermal interface materials 240 and 254 shown in FIG. 2A are intended to be a general illustration of thermal interface materials. In the following detailed description, specific details of thermal interface devices and assemblies are illustrated for given embodiments of the invention.

Figure 2B:
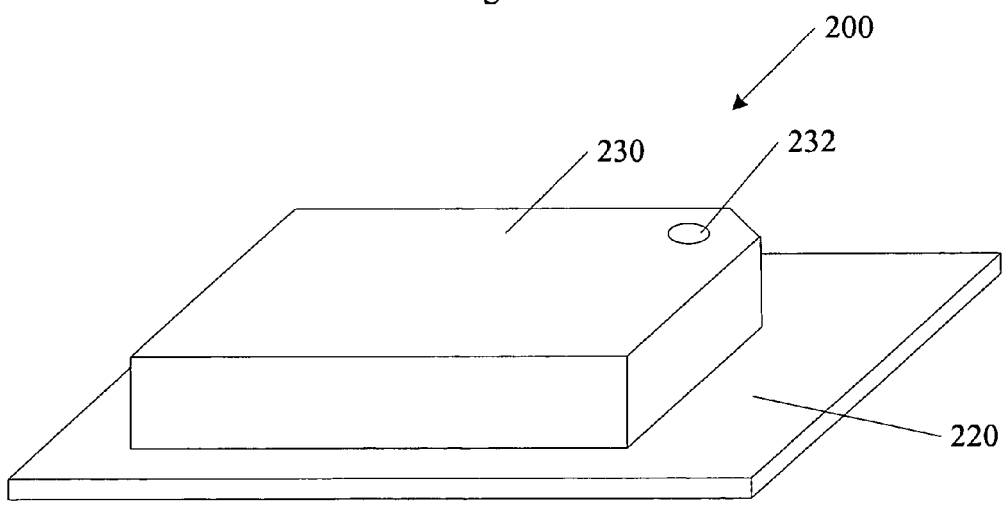
FIG. 2B is an isometric view of the IC package from FIG. 2A according to one embodiment of the invention.

FIG. 2B shows an embodiment of an IC package 230 without a heat sink attached as described above. The integrated heat spreader 230 is shown in an embodiment formed as a package cover. The edges of the integrated heat spreader 230 form an enclosure with the substrate 220 where the die (not shown) is substantially enclosed. In one embodiment, an opening 232 is included in the integrated heat spreader 230. In one embodiment, the opening provides a relief for variations in pressure due to thermal changes in the die.

Figure 3:
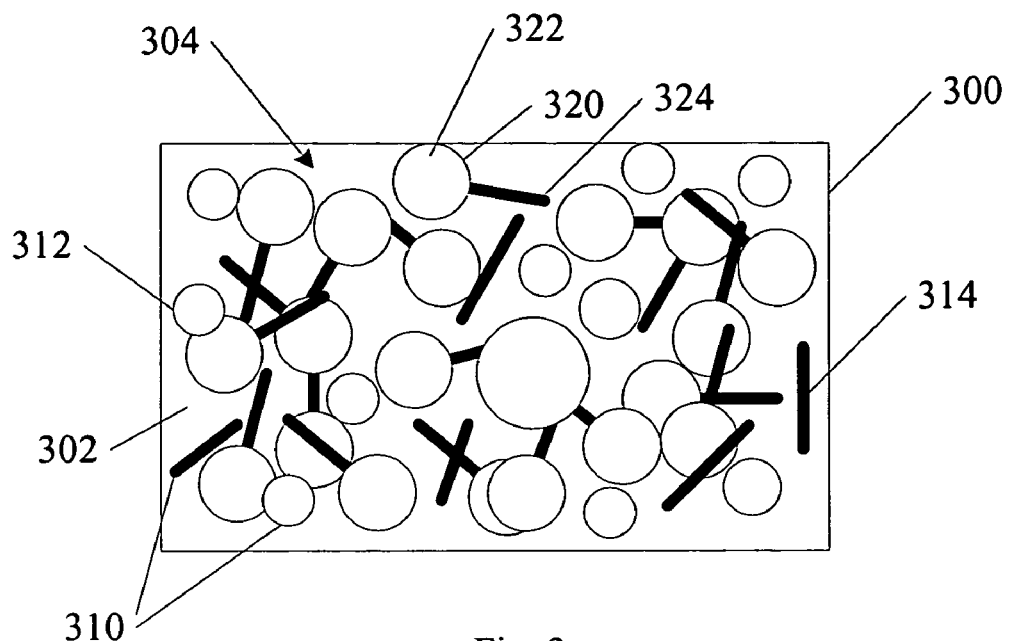
FIG. 3 illustrates a portion of a thermal interface material according to one embodiment of the invention.

FIG. 3 illustrates a magnified view of a portion of a thermal interface material 300. A matrix material 302 is illustrated as a component of the thermal interface material 300, with a distribution of particles 304 shown within the matrix material 302. In one embodiment, the matrix material 302 serves a function to hold the distribution of particles 304 in place in thermal contact with each other. In one embodiment, the distribution of particles 304 include thermally conductive particles that serve a function of conducting heat from one particle to the next, forming a thermal pathway through the thermal interface material 300.

In one embodiment, the matrix material 302 includes a polymer material. In one embodiment, the polymer includes an epoxy material. In one embodiment, the thermal interface material 300 is adapted to flow during a manufacturing process such as forming a thin layer between an IC chip and a heat transfer device. In one embodiment, the matrix material is later cured. In one embodiment, the matrix material includes indium metal. In one embodiment, the matrix material includes a solder material. In one embodiment, the solder includes an indium containing solder. In one embodiment, a solder matrix in the thermal interface material 300 is adapted to flow during a manufacturing process and later cool to a solid structure.

In one embodiment, the distribution of particles 304 includes a number of free particles 310. In the present disclosure, free particles 310 are defined as substantially homogenous particles without any additional structures attached to a surface of the particle. In one embodiment, the number of free particles 310 includes a number of substantially spherical particles 312. In one embodiment, the number of free particles 310 includes a number of particles with irregular shapes.

In one embodiment, the number of substantially spherical particles 312 includes a number of metallic particles. In one embodiment, the number of substantially spherical particles 312 includes a number of copper particles. One of ordinary skill in the art, having the benefit of the present disclosure will recognize that copper alloys or other copper containing particles are also within the scope of the present disclosure. In one embodiment, the number of substantially spherical particles 312 includes a number of silver particles. As with copper, one of ordinary skill in the art, having the benefit of the present disclosure will recognize that silver alloys or other silver containing particles are also within the scope of the present disclosure.

In one embodiment, the number of free particles 310 includes a number of carbon nanotubes 314. Carbon nanotubes have thermal conductivities on the order of five times higher than metals such as copper or silver, therefore providing increased thermal conductivity to the thermal interface material 300. In one embodiment, the distribution of particles 304 includes a number of composite particles 320. In one embodiment, the composite particle 320 includes a base particle 322 with a carbon nanotube 324 attached to a surface of the base particle 322.

In one embodiment, dimensions such as a length of carbon nanotubes is chosen to control mechanical properties of the thermal interface material 300. In one embodiment a specific size or size distribution of carbon nanotubes affects viscosity of the thermal interface material 300. Viscosity determines the force necessary in assembly to press an amount of thermal interface material 300 into a thin film. Similar to carbon nanotubes 314, in one embodiment, dimensions of the number of substantially spherical particles 312 are chosen to control mechanical properties such as viscosity of the thermal interface material 300. In one embodiment, a distribution of particle sizes are used, including free particle 310 sizes and composite particle 320 sizes.

Properties such as viscosity are important in manufacturing due to high loading factors in thermal interface materials. A loading factor or volume fraction can be defined as a ratio of volume of particles 304 divided by a volume of matrix material 302. Generally, increasing a volume fraction in a thermal interface material 300 increases the thermal conductivity of the thermal interface material 300. As IC chips such as processor chips generate more and more heat, the thermal conductivity must be increased to help dissipate more of this heat. However, as the volume fraction is increased in thermal interface materials, the viscosity can reach an unacceptable level where the thermal interface material can no longer be adequately spread on a chip surface.

Embodiments in the present disclosure provide high thermal conductivity with fewer particles in the matrix. This allows a thermal conductivity of a thermal interface material to remain the same, while reducing viscosity. This also allows a thermal conductivity to be increased while maintaining a given viscosity. In selected embodiments, a thermal conductivity is increased, and at the same time viscosity is decreased.

Figure 4:
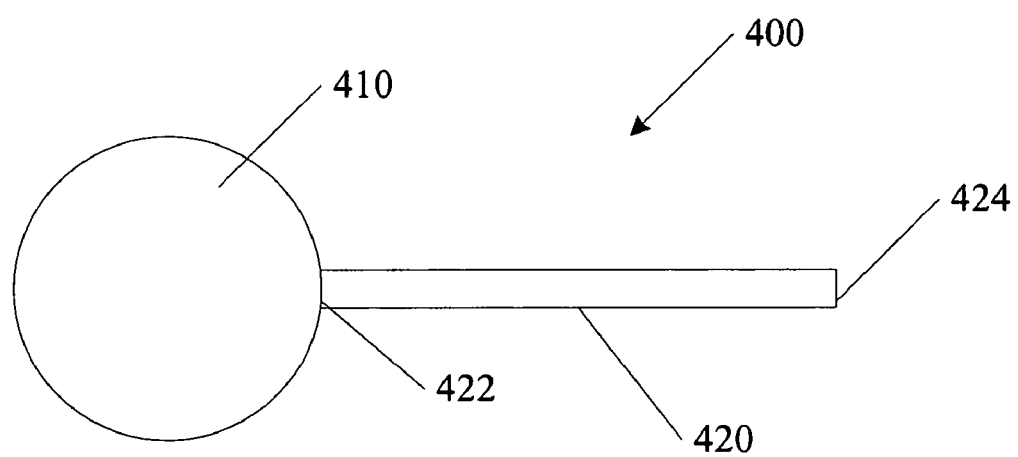
FIG. 4 illustrates a thermal interface particle according to one embodiment of the invention.

FIG. 4 shows a single composite particle 400 similar to the composite particle 320 shown in FIG. 3. A base particle 410 is shown, with a carbon nanotube 420 attached to a surface of the base particle 410. In one embodiment, the base particle 410 includes a substantially spherical particle, although the invention is not so limited. In one embodiment, the base particle 410 includes a particle with an irregular shape having a mean diameter. Other geometries of base particles 410 are also within the scope of the invention. In one embodiment, the base particle includes thermally conductive particle such as a metallic particle. In one embodiment, the base particle includes copper. In one embodiment, the base particle includes silver.

A shown in FIG. 4, in one embodiment, the carbon nanotube 420 is attached to the base particle 410 at a first end 422 of the nanotube 420 with a distal end 424 extending from the base particle 410. In one embodiment, the carbon nanotube 420 is attached at another interface location such as along a side of the carbon nanotube 420. In one embodiment, the composite particle 400 is formed by growing the carbon nanotube 420 on a surface of the base particle 410. In one embodiment, the carbon nanotube 420 is formed separately and later attached to the surface of the base particle 410.

Figure 5:
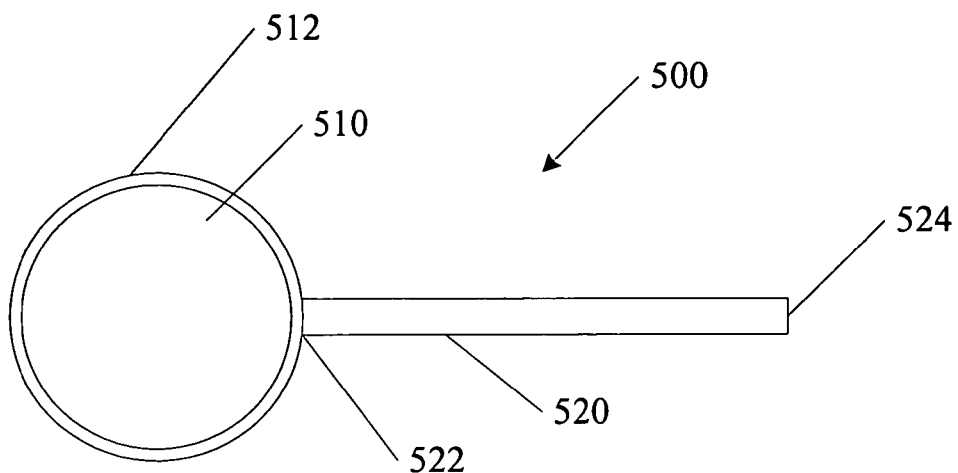
FIG. 5 illustrates another thermal interface particle according to one embodiment of the invention.

FIG. 5 shows a composite particle 500 according to another embodiment of the invention. A base particle 510 is shown with a carbon nanotube 520 coupled to a surface of the base particle 510. As shown in FIG. 5, in one embodiment, the carbon nanotube 520 is coupled to the base particle 510 through an intermediate coating 512. An advantage of using an intermediate coating 512 includes the ability to couple a carbon nanotube 520 to base particle 510 where the base particle material normally does not adhere well to a carbon nanotube. In one embodiment, the intermediate coating 512 includes nickel. Other intermediate coatings 512 include, but are not limited to, cobalt, iron, and gold. In one embodiment, the base particle 510 includes copper. In one embodiment, the base particle 510 includes silver. Although one intermediate coating is shown in FIG. 5, the invention is not so limited. In one embodiment multiple intermediate coatings are used. Although FIG. 5 shows a continuous coating 512 surrounding the base particle 510, the invention is not so limited. In one embodiment, an intermediate material covers only a local area between a portion of a nanotube and a base particle Similar to FIG. 4, the carbon nanotube 520 is shown attached to the base particle 510 at a first end 522 with a distal end 524 extending from the base particle 510. In one embodiment, the carbon nanotube 520 is attached at another interface location such as along a side of the carbon nanotube 520. In one embodiment, the composite particle 500 is formed by growing the carbon nanotube 520 on a surface of the base particle 510. In one embodiment, a base particle 510 is grown on the carbon nanotube 520.

Referring back to FIG. 3, any of several combinations of particles 304 and matrix materials 302 are within the scope of the invention. One example includes a polymer matrix material 302 and a composite particle 320 having a copper sphere base particle 322 with a carbon nanotube 324 attached. Another example includes an indium solder matrix material 302 and a composite particle 320 having a silver base particle 322 with a carbon nanotube 324 attached. Although specific examples are mentioned, the invention is not so limited. Other combinations of particles such as composite particles and matrix materials will be recognized as possibilities to one of ordinary skill in the art, having the benefit of the present disclosure.

Figure 6:
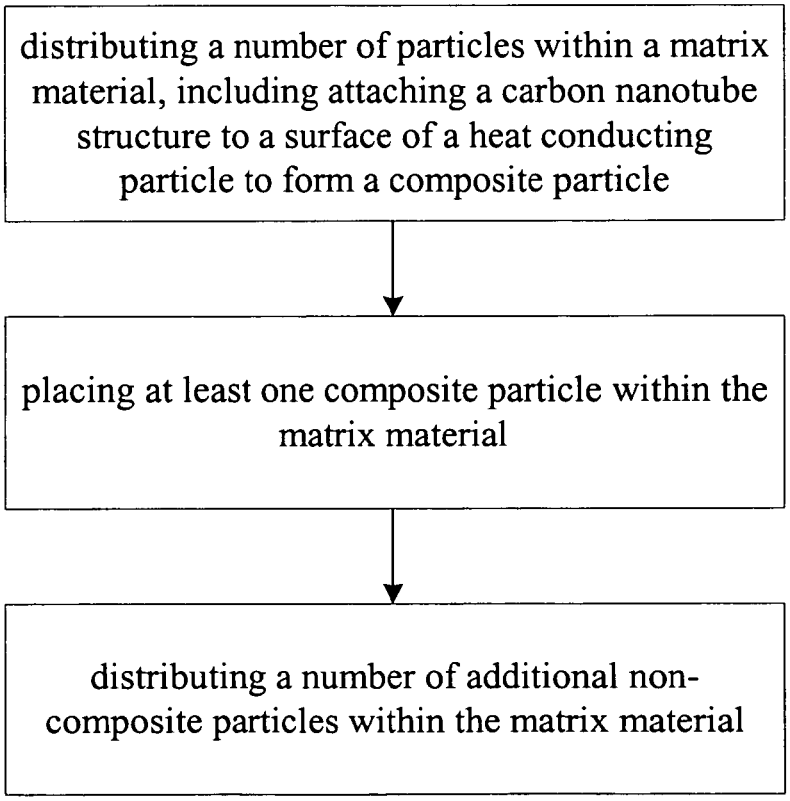
FIG. 6 illustrates a method according to one embodiment of the invention.

FIG. 6 shows a flow diagram of one example method according to an embodiment of the invention. A number of particles are distributed within a matrix material, including attaching a carbon nanotube structure to a surface of a heat conducting particle to form a composite particle. At least one composite particle is placed within the matrix material. In one embodiment, a number of additional non-composite particles are further distributed within the matrix material. Although three operations are shown, other methods may include fewer operations, or more operations. In one embodiment, the operations are performed in the order shown in FIG. 6, although the invention is not so limited.

An advantage of using composite particles as described above includes increased thermal conductivity of an associated thermal interface material. Carbon nanotubes are known to be extremely good thermal conductors. For example, carbon nanotubes conduct heat approximately 5 times better than copper and silver.

One mechanism of thermal conduction in a thermal interface material includes conducting of heat through contact points of various distributed particles. In conducting heat through a carbon nanotube, the heat must flow from a first location, through the nanotube to a second location. Conduction through free carbon nanotubes in a matrix requires two contact points on a given carbon nanotube, thus allowing thermal conduction through all, or a portion of the nanotube. An amount of thermal conduction can also be lower through a point contact than through a larger contact surface area such as described above in a composite particle embodiment.

In embodiments using a composite particle as described above, at least one large contact interface pathway is ensured between the carbon nanotube and the associated base particle due to the physical attachment. Embodiments using composite particles as described above will therefore be much more likely to form two thermal contact points along a nanotube, with at least one contact having a large interface area.

Another advantage of embodiments using composite particle as described above includes decreased viscosity as a result of a decreased volume fraction of particles. Higher conductivity of composite particles allows the volume fraction to be reduced while maintaining or increasing the thermal conductivity of the thermal interface material.

A thermal interface material has been shown with at least a fraction of composite particles. Advantages include increased thermal conductivity and improved mechanical properties such as lower viscosity. In selected embodiments free particles such as metallic particles or carbon nanotubes, etc. are included in a thermal interface material along with composite particles. An advantage of including free particles along with composite particles includes improved packing density within selected embodiments of thermal interface materials.

Although selected advantages are detailed above, the list is not intended to be exhaustive. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of embodiments described above. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A thermal conducting material comprising:
   a matrix material;
   a distribution of separate particles within the matrix material, at least one particle including:
   a heat conducting particle; and
   a carbon nanotube structure attached at only one end to a surface of the heat conducting particle, and configured to remain attached at the same attachment location on the heat conducting particle during spreading of the thermal conducting material.

2. The thermal conducting material of claim 1, wherein the heat conducting particle includes a metallic particle.

3. The thermal conducting material of claim 2, wherein the heat conducting particle includes a copper particle.

4. The thermal conducting material of claim 2, wherein the heat conducting particle includes a silver particle.

5. The thermal conducting material of claim 1, wherein the matrix material includes a polymer matrix material.

6. The thermal conducting material of claim 1, wherein the matrix material includes a solder matrix material.

7. The thermal conducting material of claim 1, wherein the matrix material includes indium.

8. The thermal conducting material of claim 1, wherein the distribution of particles further includes a distribution of free particles.

9. The thermal conducting material of claim 8, wherein the distribution of free particles includes copper spheres.

10. The thermal conducting material of claim 8, wherein the distribution of free particles includes silver particles.

11. The thermal conducting material of claim 8, wherein the distribution of free particles includes a distribution of carbon nanotubes.

12. A thermal conducting material comprising:
    a matrix material;
    a distribution of particles within the matrix material, at least one particle including:
    a heat conducting particle;
    an intermediate coating material surrounding the heat conducting particle; and
    a carbon nanotube structure attached to the intermediate coating material, and configured to remain attached at the same attachment location during spreading of the thermal conducting material.

13. The thermal conducting material of claim 12, wherein the intermediate coating material includes nickel.

14. The thermal conducting material of claim 12, wherein the intermediate coating material includes gold.

15. The thermal conducting material of claim 12, wherein the matrix material includes a polymer matrix material.

16. The thermal conducting material of claim 12, wherein the matrix material includes a solder matrix material.

17. The thermal conducting material of claim 16, wherein the solder matrix material includes indium.

18. A system comprising:
    a processor chip;
    a thermal interface layer coupled to the processor chip, including:
    a matrix material;
    a distribution of separate particles within the matrix material, at least one particle including:
    a heat conducting particle;
    a carbon nanotube structure attached at only one end to an exterior surface of the heat conducting particle, and configured to remain attached at the same attachment location on the heat conducting particle during application of the thermal interface layer;
    a heat transfer device coupled to the thermal interface layer;
    a dynamic random access memory device; and
    a system bus coupling the memory device and the processor chip.

19. The system of claim 18, wherein the matrix material includes a polymer matrix material and the heat conducting particle includes a copper particle.

20. The system of claim 18, wherein the matrix material includes an indium containing solder matrix material and the heat conducting particle includes a silver particle.

21. The system of claim 18, wherein the dynamic random access memory device includes a dual data rate dynamic random access memory device.

22. The thermal conducting material of claim 12, wherein particles in the distribution of particles are each separate, and the carbon nanotube structure is attached at only one end to the intermediate coating material.

* * * * *